United States Patent
Zhang et al.

(10) Patent No.: US 9,226,389 B2
(45) Date of Patent: Dec. 29, 2015

(54) QUICKLY-MOUNTED CAPACITOR

(71) Applicants: SHANGHAI HAOYE ELECTRIC CO., LTD, Shanghai (CN); SHANGHAI HAOYE CAPACITORS CO., LTD, Shanghai (CN)

(72) Inventors: Zikui Zhang, Shanghai (CN); Feng Xu, Shanghai (CN); Hao Pan, Shanghai (CN)

(73) Assignees: SHANGHAI HAOYE CAPACITORS CO., LTD., Shanghai (CN); SHANGAI HAOYE ELECTRIC CO., LTD., Shanghai (CN)

( * ) Notice: Subject to any disclaimer, the term of this patent is extended or adjusted under 35 U.S.C. 154(b) by 147 days.

(21) Appl. No.: 14/234,635

(22) PCT Filed: Sep. 25, 2012

(86) PCT No.: PCT/CN2012/001304
§ 371 (c)(1),
(2) Date: Jan. 24, 2014

(87) PCT Pub. No.: WO2013/123628
PCT Pub. Date: Aug. 29, 2013

(65) Prior Publication Data
US 2014/0190731 A1 Jul. 10, 2014

(30) Foreign Application Priority Data
Feb. 24, 2012 (CN) ................... 2012 2 0061885 U

(51) Int. Cl.
H05K 1/02 (2006.01)
H01G 2/06 (2006.01)
H05K 3/30 (2006.01)

(52) U.S. Cl.
CPC ............... *H05K 1/0256* (2013.01); *H01G 2/06* (2013.01); *H05K 3/301* (2013.01); *H05K 2201/09063* (2013.01); *H05K 2201/10015* (2013.01); *H05K 2201/2072* (2013.01)

(58) Field of Classification Search
CPC ........ H05K 1/0256; H05K 3/301; H01G 2/06
USPC .......................................... 174/258; 361/821
See application file for complete search history.

(56) References Cited

U.S. PATENT DOCUMENTS

| 4,314,213 A * | 2/1982 | Wakino ......................... 333/182 |
| 5,673,168 A * | 9/1997 | Efford et al. .................. 361/518 |
| 2004/0246652 A1* | 12/2004 | Will et al. ..................... 361/271 |

FOREIGN PATENT DOCUMENTS

CN 201749784 * 2/2012

*Primary Examiner* — Timothy Thompson
*Assistant Examiner* — Charles Pizzuto
(74) *Attorney, Agent, or Firm* — Kening Li; Miller Canfield

(57) ABSTRACT

A quickly-mounted capacitor consists of a capacitor (1) and a plug piece (10). The quickly-mounted capacitor is characterized in that a fixation mounting rod (22) or a screw (21) is extended from a lower end of a housing of the capacitor (1); the plug piece (10) comprises an insulating sheet (11) arranged in an upper portion, and a lower portion of the insulting sheet (11) is connected to an upper end of a connection part (13); a lower end of the connecting part (13) is connected to a plastic elastic card (12) to form a plastic anchor-shaped elastic card. An upper portion of the plug piece (10) is provided with a capacitor mounting hole (15). The capacitor not only is convenient to plug, but also can effectively play a role in insulation and prevent the accident caused by conducting leak electricity to an electric appliance casing when abnormal electricity leakage occurs in the capacitor.

5 Claims, 6 Drawing Sheets

QUICKLY-MOUNTED CAPACITOR

FIELD OF THE INVENTION

The utility model relates to a capacitor, particularly a quickly-mounted capacitor.

BACKGROUND

A fixation and mounting structure of the present capacitor is as that FIG. 1 illustrates, which adopts a gasket 7 and a screw nut 8 for fixation and mounting. The drawbacks of such kind of capacitor are as follows: 1) a set of gasket 7 and screw nut 8 is needed, and it requires a high standard for the performance for salt-spray resistance of the gasket 7 and screw nut 8, which is quite difficult to achieve. 2) Difficulty in fixation and mounting, and the case goes worse with a small mounting space. 3) When abnormal electricity leakage occurs in the capacitor, it happens that the electricity leaked is conducted to an electric appliance casing through the fixation mounting screw 21, gasket 7 and screw nut 8, thus causing accidents.

Another fixation and mounting structure of the present capacitor is as that FIG. 2 illustrates, which adopts a fast plug & connect structure for the capacitor. The advantage of this kind of capacitors is that the mounting procedure is of low complexity and not restricted from the size of mounting space. But there are disadvantages as follows: 1) an anchor shaped elastic card 5 is needed, which is made of spring steel sheet, and it requires a high standard for the performance for salt-spray resistance of the gasket 7 and screw nut 8, which is quite difficult to achieve; 2) an extra process has to be performed ahead of fixing the anchor shaped elastic card 5 on the housing; 3) When abnormal electricity leakage occurs in the capacitor, it happens that the electricity leaked is conducted to an electric appliance casing through the anchor shaped elastic card 5, thus causing accidents.

SUMMARY OF THE INVENTION

It is an object to provide a quickly-mounted capacitor, mainly to solve the problems of above mentioned present techniques. It is not only easy to plug and can also achieve an effective insulation performance to prevent the accidents caused by the conducting of the electricity leaked to an electric appliance casing, when abnormal electricity leakage occurs in the capacitor.

To realize the object, the utility model is implemented as follows:

A quickly mounted capacitor consists of a capacitor and a plug piece, characterized in that, a fixation mounting rod or screw extend from the lower end of the housing of said capacitor; said plug piece contains an insulating sheet set on the up portion, the lower portion of the insulating sheet connects to an up end of a connection part, and the lower end of the connecting part connects to a plastic elastic card to form a plastic anchor shaped elastic card; the up portion of the plug piece is provided with a capacitor mounting hole.

Said quickly mounted capacitor is characterized in that, the fixation mounting rod or screw of said capacitor are inserted and fixed into the capacitor mounting hole of the plug piece.

Said quickly mounted capacitor is characterized in that, the up end of said plastic elastic card is provided with a mounting slot.

Said quickly mounted capacitor is characterized in that, the lower portion of said insulating sheet is provided with a firmness bar.

Said quickly mounted capacitor is characterized in that, the surrounding edge of the up portion of said insulating sheet is provided with an annular wall, and the annular wall and the insulating sheet form a shape of a bowl.

With the structure mentioned above, the utility model has following advantages:

1. The utility model adopts a plug and connecting structure of an anchor shaped plastic elastic card, making the plug and fixation of the capacitor easy to implement.
2. The plug structure of the utility model is all made of insulating materials, thus making a good insulation performance and effectively preventing the conducting of the electricity leaked to electric appliance casing when the electricity leakage occurs in the capacitor.

Figure 1:
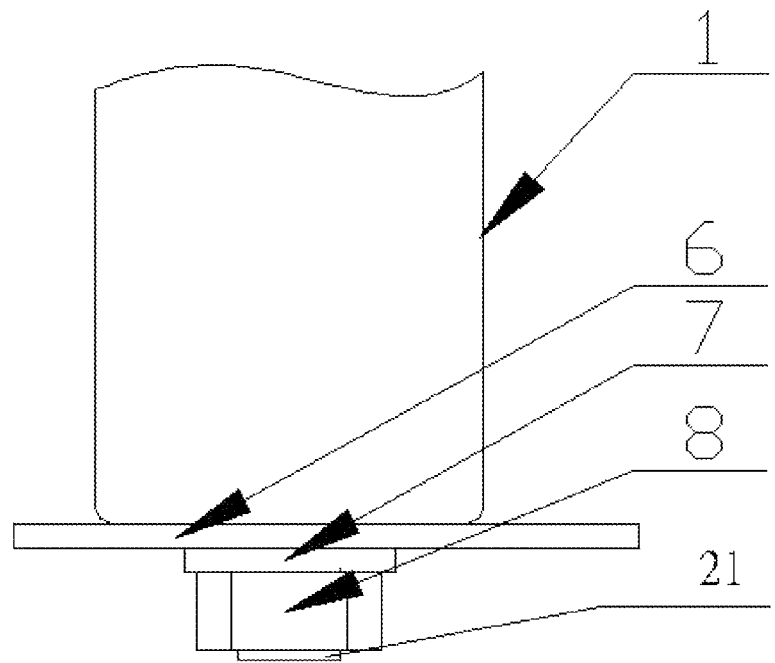
FIG. 1 is a schematic illustration of a present mounting structure for capacitors.
Figure 2:
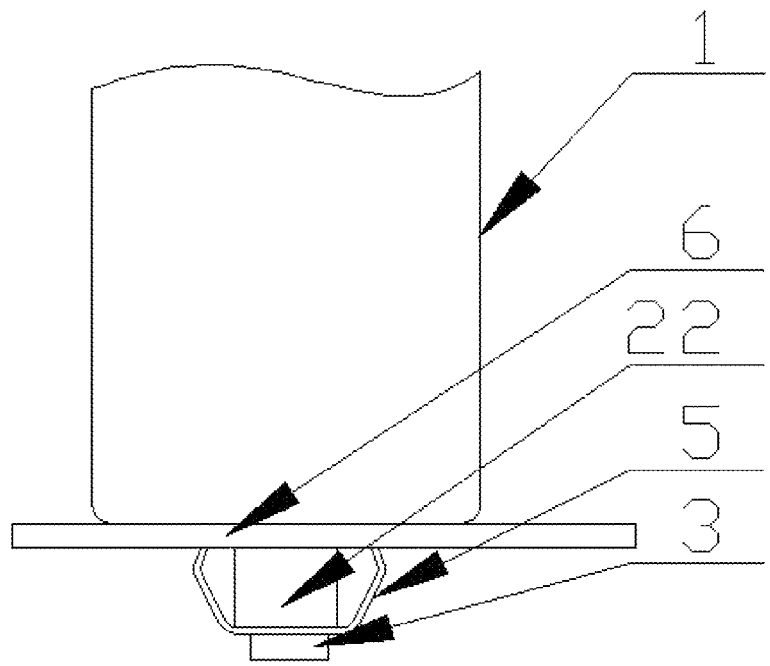
FIG. 2 is another schematic illustration of a present mounting structure for capacitors.
Figure 3:
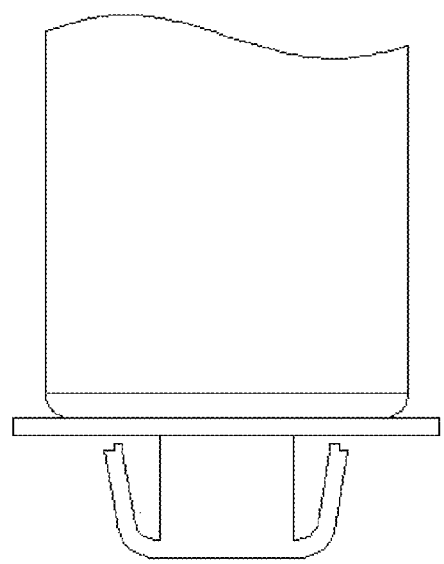
FIG. 3 is a schematic illustration of the $1^{st}$ embodiment of the utility model.
Figure 4:
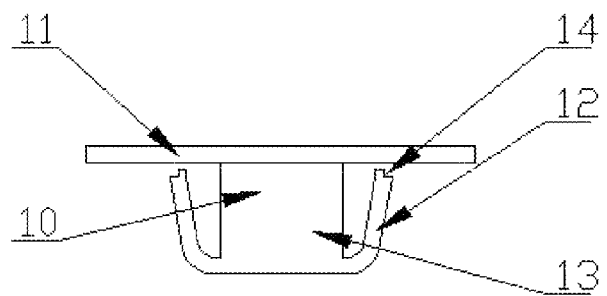
FIG. 4 is a schematic illustration of the plug piece in the $1^{st}$ embodiment of the utility model.
Figure 5:
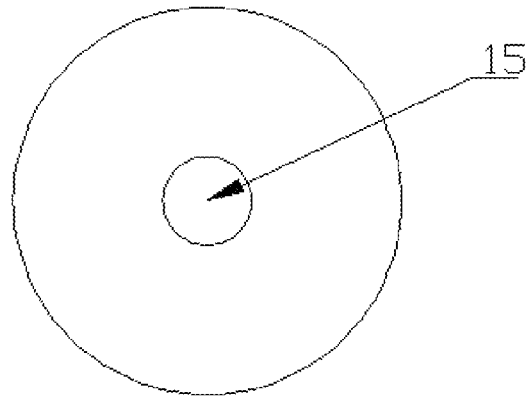
FIG. 5 is a vertical view of the plug piece in the $1^{st}$ embodiment of the utility model.
Figure 6:
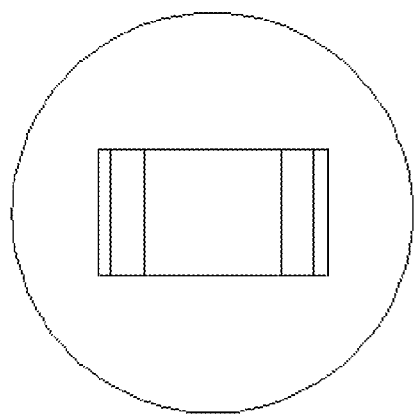
FIG. 6 is a bottom view of the plug piece in the $1^{st}$ embodiment of the utility model.
Figure 7:
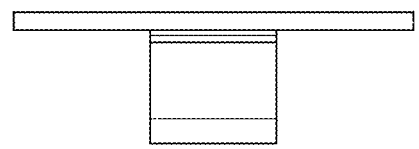
FIG. 7 is a side view of the plug piece in the $1^{st}$ embodiment of the utility model.
Figure 8:
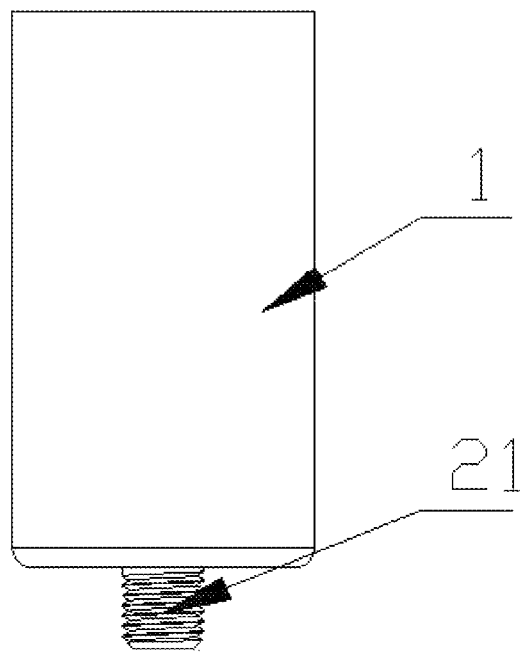
FIG. 8 is a schematic illustration of the capacitor housing in the $1^{st}$ embodiment of the utility model.

In the figures, 1-capacitor; 21-fixation mounting screw; 22-fixation mounting rod; 3-fixation column for plastic card; 5-anchor shaped elastic card; 6-fixation mounting plank; 7-gasket; 8-screw nut; 10-plug piece; 11-insulating sheet; 12-plastic elastic card; 13-connecting part; 14-slot for the mounting plank; 15-capacitor mounting hole; 16-firmness bar.

DESCRIPTION OF THE PREFERRED EMBODIMENT

Please refer to FIGS. 3-8, they are schematic illustrations of the $1^{st}$ embodiment of the utility model. As the figures illustrate, it consists of a capacitor 1 and a plug piece 10. A fixation mounting rod 22 or screw 21 is extended from a lower end of a housing of said capacitor 1; said plug piece 10 includes an insulating sheet 11 set on an upper portion. The lower portion of the insulating sheet connects to an up end of connecting part 13. A lower end of the connecting part 13 connects to plastic elastic card 12, forming a plastic anchor shaped elastic card; The upper portion of the plug piece is provided with a capacitor mounting hole 15 for electric appliance. The fixation mounting rod 22 or screw 21 of said capacitor 1 is inserted and fixed into the capacitor mounting hole 15 of plug piece 10.

Figure 9:
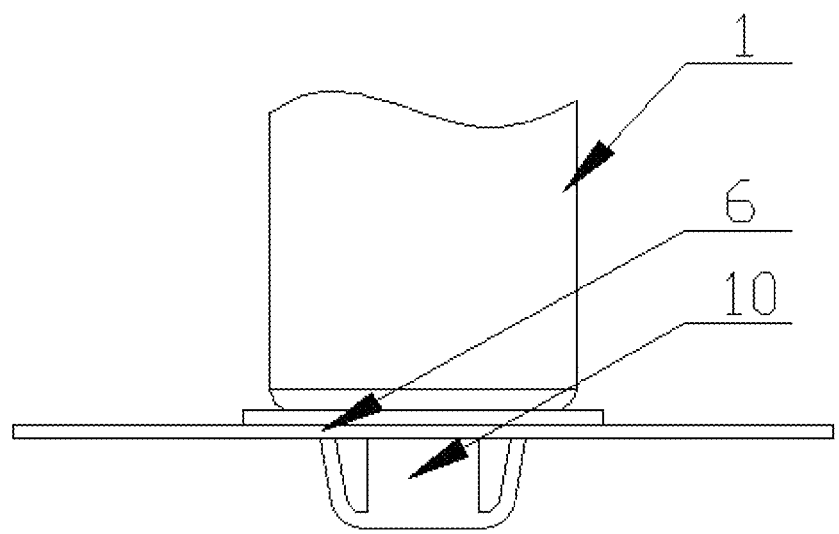
FIG. 9 is an illustration of the mounting procedure for the $1^{st}$ embodiment of the utility model.

In the embodiment, it is easy to insert into fixation mounting plank 6 by means of an anchor shaped plastic elastic card connected to the lower end of said capacitor 1, that is, the fixation mounting plank 6 locates between the upper end of plastic elastic card 12 and insulating piece 11, and is fixed tightly by the plastic elastic card 12, as FIG. 9 illustrates. It realizes the quick mounting of the capacitor. Due to the insulating materials adopted for the plug structure of the capacitor, it makes an effective insulation performance and prevents the conducting of the electricity leaked to electric appliance casing when abnormal electricity leakage occurs in the capacitor.

Figure 10:
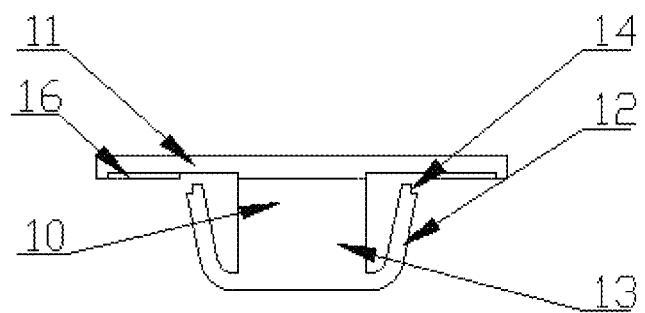
FIG. 10 is a schematic illustration of the plug piece in the $2^{nd}$ embodiment of the utility model.
Figure 11:
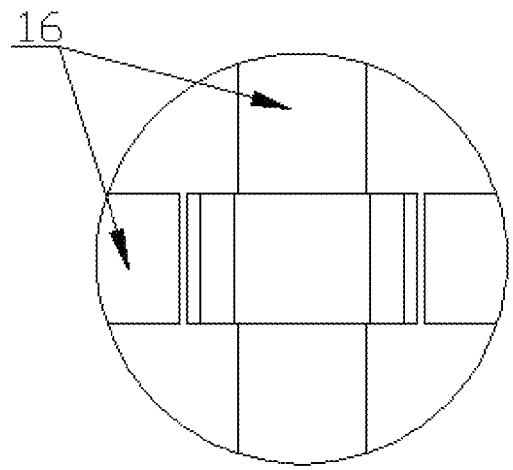
FIG. 11 is a bottom view of FIG. 10.

Please refer to FIGS. 10-11, they are a schematic illustration of the plug piece in the $2^{nd}$ embodiment of the utility model. As figures illustrate: it not only has a same basic structure and function, but also has its difference from $1^{st}$ embodiment, mainly on: the lower portion of said insulating sheet 11 is provided with firmness bar 16 to enhance the connection firmness between the capacitor 1 and the fixation plank 6, and also contributes to perform an effective mounting, preventing the slide of the fixation plank into the gap between elastic card and insulating sheet.

Figure 12:
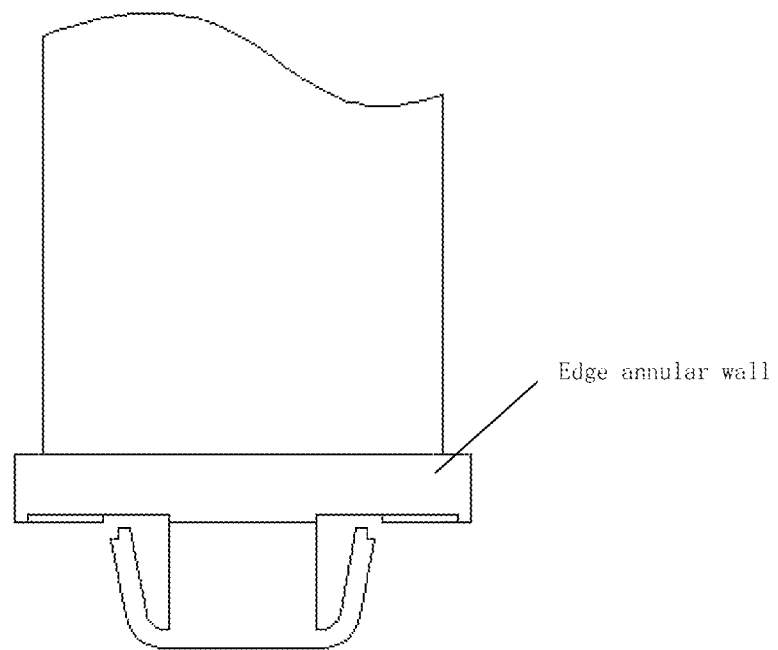
FIG. 12 is a schematic illustration of the plug piece in the $3^{rd}$ embodiment of the utility model.
Figure 13:
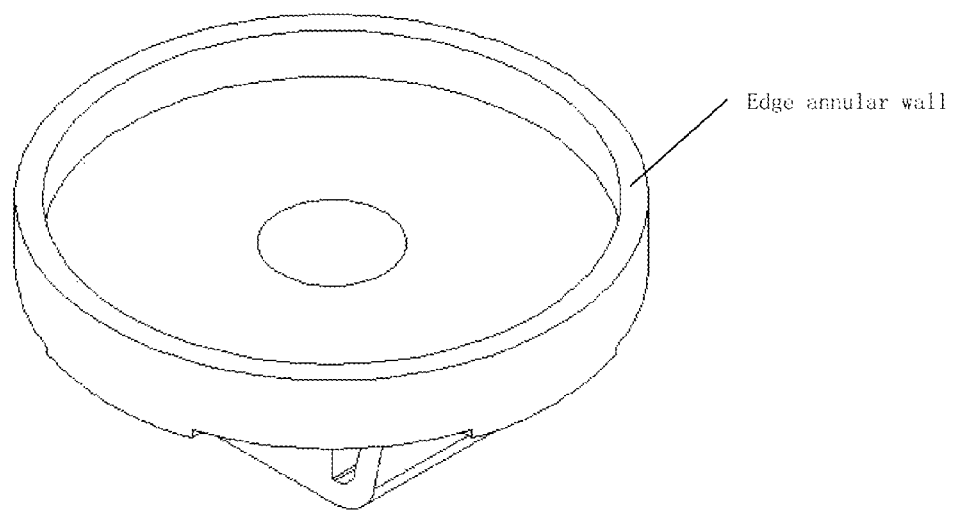
FIG. 13 is a schematic illustration of the plug piece in the $3^{rd}$ embodiment of the utility model.

Please refer to FIGS. 12-13, they are schematic illustrations of the plug piece in the $3^{rd}$ embodiment of the utility model. In the embodiment, it has the same basic structure as that of $1^{st}$ embodiment, but with a different feature as: the up portion of said insulating sheet 11 is provided with an edge annular wall. The annular wall and insulating sheet 11 form a shape of a bowl to enlarge electric clearance and prolong creepage distance.

All mentioned above are only the preferred embodiments, not to restrict the implementation scope of the utility model. Any equivalent change and polishing of the content of the utility model should be considered with the protection scope of the utility model.

What is claimed is:

1. A quickly mounted capacitor consists of a capacitor (1) and a plug piece (10), characterized in that, a fixation mounting rod (22) or screw (21) extend from the lower end of the housing of said capacitor(1); said plug piece (10) contains an insulating sheet (11) set on the up portion, the lower portion of the insulating sheet (11) connects to an up end of a connection part (13), and the lower end of the connecting part (13) connects to a plastic elastic card (12) to form a plastic anchor shaped elastic card; the up portion of the plug piece is provided with a capacitor mounting hole (15).

2. The quickly mounted capacitor according to claim 1, characterized in that, the fixation mounting rod (22) or screw (21) of said capacitor (1) are inserted and fixed into the capacitor mounting hole (15) of the plug piece (10).

3. The quickly mounted capacitor according to claim 1 or 2, characterized in that, the up end of said plastic elastic card (12) is provided with a mounting slot (14).

4. The quickly mounted capacitor according to claim 1 or 2, characterized in that, the lower portion of said insulating sheet (11) is provided with a firmness bar (16).

5. The quickly mounted capacitor according to claim 1 or 2, characterized in that, the surrounding edge of the up portion of said insulating sheet (11) is provided with an annular wall, and the annular wall and the insulating sheet (11) form a shape of a bowl.

\* \* \* \* \*